(12) United States Patent
Sillup et al.

(10) Patent No.: US 6,292,008 B1
(45) Date of Patent: Sep. 18, 2001

(54) CIRCUIT CONFIGURATION FOR BURN-IN SYSTEMS FOR TESTING MODULES BY USING A BOARD

(75) Inventors: Joseph Sillup, München; Frank Weber, Kraiburg/Inn, both of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/322,717

(22) Filed: May 28, 1999

(30) Foreign Application Priority Data

May 28, 1998 (DE) ............................................. 198 23 943

(51) Int. Cl.⁷ .................................................. G01R 31/26
(52) U.S. Cl. ............................................ 324/760; 324/765
(58) Field of Search ..................................... 324/760, 765, 324/158.1, 73.1, 763; 714/726, 728, 729, 730, 733

(56) References Cited

U.S. PATENT DOCUMENTS 5,442,282 * 8/1995 Restoker et al. ................. 324/158.1

FOREIGN PATENT DOCUMENTS 196 10 123
C1   10/1997 (DE) .

* cited by examiner

*Primary Examiner*—Safet Metjahic
*Assistant Examiner*—T. R. Sundaram
(74) *Attorney, Agent, or Firm*—Herbert L. Lerner; Laurence A. Greenberg; Werner H. Stemer

(57) ABSTRACT

A burn-in system uses a board for testing modules disposed like a matrix in the board. A circuit configuration includes module terminals for the modules in the board. Input/output channels are each connected to a respective one of the module terminals. Diodes are each connected to a respective one of the input/output channels. A scan signal terminal is connected to the diodes for activating the module terminals in groups with scan signals.

5 Claims, 1 Drawing Sheet

CIRCUIT CONFIGURATION FOR BURN-IN SYSTEMS FOR TESTING MODULES BY USING A BOARD

BACKGROUND OF THE INVENTION

Field of the Invention

The present invention relates to a circuit configuration for burn-in systems using boards for testing modules disposed like a matrix in the boards, in which the modules in the boards can be connected to input/output channels and can be activated in groups by scan signals.

In the testing of burn-in systems, that is to say systems in which modules are checked for freedom from defects under high-temperature conditions on the order of magnitude of 130° C., and which have a small number of input/output channels for the modules, the number of modules per board or test panel is limited not only by a base size of the respective modules but also by a number of available scan signals. Scan signals or "Enable" signals are used in testing burn-in systems for the purpose of activating a group of modules to be tested for evaluation.

In testing burn-in systems, it is virtually always the case that the maximum possible number of input/output channels of those systems is used. An example that may be mentioned is a burn-in system having 64 input/output channels. If modules with 16 data inputs and/or outputs are tested in such a burn-in system, then it is thus possible to evaluate four modules ("4×16=64") in parallel.

However, in such a testing of burn-in systems, the number of scan signals is likewise limited and is at most about 32 to 40 signals depending on the system. Thus, it is then possible to test 160 modules ("4×40") in one board, with the result that a maximum board density of approximately 160 modules is given in that case.

On the other hand, in the case of modules with 4 or 8 data outputs, that is to say in the case of "x4" or "x8" organized modules, the board density, limited by the base size, is about 256.

Previously, for the individual module configurations, boards adapted to the requirements of those configurations have been developed in each case especially for each configuration. Since different configurations accommodated in one type of housing have recently been seen, especially in the case of SDRAM modules, the development of separate boards for each of those configurations is extremely complicated. It could be advantageous, therefore, if modules which are accommodated in the same type of housing could be tested by using just one board in a circuit configuration for burn-in systems.

SUMMARY OF THE INVENTION

It is accordingly an object of the invention to provide a circuit configuration for burn-in systems for testing modules by using a board, which overcomes the hereinaforementioned disadvantages of the heretofore-known devices of this general type and in which more highly organized modules than previous modules can also be tested and burned in with the same board density.

With the foregoing and other objects in view there is provided, in accordance with the invention, in a burn-in system using a board for testing modules disposed like a matrix in the board, a circuit configuration comprising module terminals for the modules in the board; input/output channels each connected to a respective one of the module terminals; diodes each connected to a respective one of the input/output channels; and a scan signal terminal connected to the diodes for activating the module terminals in groups with scan signals.

In accordance with a concomitant feature of the invention, the module is a memory, and both of the input/output channels receiving the scan signal can be activated simultaneously when data are written to the memory and sequentially when data are read from the memory.

The use of the diodes in conjunction with the scan signals thus enables, by way of example, "x16"-organized modules to be tested and burned in with the same board density as "x4" or "x8"-organized modules.

If use is made specifically of two diodes and thus of two system signals passed through the diodes, then the "x16"-organized modules can be tested as "x8"-modules. The only precondition in this case is that the "x16"-organized module contain at least two module terminals for the activation of the data outputs, which is applicable in the case of the previous SDRAMs, for example.

When data are written to such an SDRAM memory, two clocks are thus activated through the two module terminals, with the result that the information is written in through all 16 data inputs. When the data are read, firstly one clock and thus the eight data outputs assigned to this clock are activated and evaluated. This is followed by the second clock with the other eight data outputs assigned thereto.

The invention has the particular advantage that, irrespective of the organization ("x4", "x8" or "x16"), just one burn-in board can be used for all configurations. This is of great advantage for production, since the latter can immediately be adapted to new developments or other changes in the configuration of the modules.

Other features which are considered as characteristic for the invention are set forth in the appended claims.

Although the invention is illustrated and described herein as embodied in a circuit configuration for burn-in systems for testing modules by using a board, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The figure of the drawing is a schematic diagram of a circuit configuration according to the invention.

DESCRIPTION OF THE PREFERRED EMBODIMENTS

Figure 1:
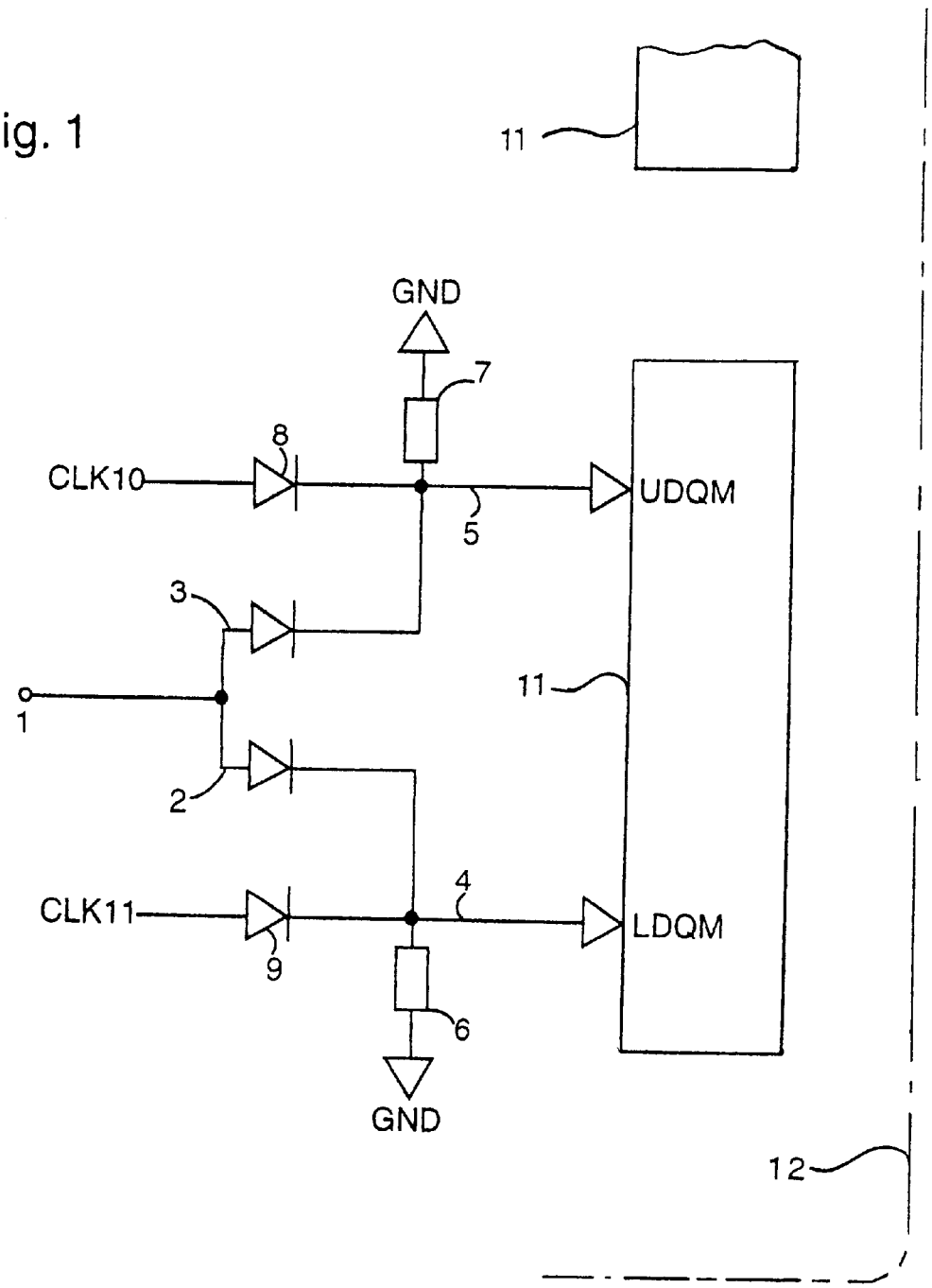

Referring now in detail to the single figure of the drawing, there is seen a terminal 1, at which a scan signal is present and is fed through two diodes 2, 3 to input channels 4, 5 for activation of data inputs/outputs. Clocks or clock signals CLK11, CLK10 are present at the input channels 4, 5 which are connected to module terminals LDQM and UDQM. The module terminals LDQM and UDQM are connected to one of several modules 11 disposed in a matrix-like pattern on a board 12. Nodes between the clocks and the scan signals are each connected to ground GND through a respective resistor 6, 7 of about 500 ohms. The clocks CLK10, CLK11 are likewise fed in through diodes 8, 9.

In the case of the circuit configuration according to the invention, the scan signal is then "distributed" between the two input channels 4, 5 through the diodes 2, 3. As a result, in the same way, more highly organized modules than, for example, "x8"-organized modules can also be tested and burned in with the same board density.

We claim:

1. In a burn-in system using a board for testing modules disposed like a matrix in the board, a circuit configuration, the improvement comprising:
   a board adopted for testing various different modules with differing input/output channel configurations;
   module terminals for the modules in the board;
   at least two input/output channels each connected to a respective one of said module terminals; and
   a scan signal terminal connected to said at least two input/output channels, thereby, activating said module terminals in groups with scan signals.

2. The burn-in system according to claim 1, wherein said at least two input/output channels receiving the scan signal can be activated simultaneously when data are written to the memory and sequentially when data are read from the memory.

3. The burn-in system according to claim 1, wherein said module is a memory module.

4. The burn-in system according to claim 1, wherein said at least two input/output channels are two input/output channels.

5. The burn-in system according to claim 1, further comprising a diode placed between said scan signal terminal and said at least two input/output channels.

* * * * *